(12) United States Patent
Fischer et al.

(10) Patent No.: US 10,000,840 B2
(45) Date of Patent: Jun. 19, 2018

(54) PISTON RING FOR INTERNAL COMBUSTION ENGINES

(75) Inventors: Manfred Fischer, Leichlingen (DE); Ralf Lammers, Wermelskirchen (DE); Christiane Bauer, Burscheid (DE); Steffen Hoppe, Overath (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 342 days.

(21) Appl. No.: 12/444,217

(22) PCT Filed: Oct. 1, 2007

(86) PCT No.: PCT/EP2007/060357
§ 371 (c)(1),
(2), (4) Date: Apr. 3, 2009

(87) PCT Pub. No.: WO2008/040695
PCT Pub. Date: Apr. 10, 2008

(65) Prior Publication Data
US 2010/0044969 A1    Feb. 25, 2010

(30) Foreign Application Priority Data
Oct. 4, 2006   (DE) .................. 10 2006 046 915

(51) Int. Cl.
*F16J 9/26*   (2006.01)
*C23C 14/06*   (2006.01)
(Continued)

(52) U.S. Cl.
CPC ........ *C23C 14/0641* (2013.01); *C23C 28/044* (2013.01); *C23C 28/42* (2013.01); *F16J 9/26* (2013.01)

(58) Field of Classification Search
CPC ... C23C 28/044; C23C 28/42; C23C 14/0641; F16J 9/26
(Continued)

(56) References Cited

U.S. PATENT DOCUMENTS 4,554,201 A    11/1985  Andreev et al.
4,734,339 A *   3/1988  Schachner et al. ........... 428/701
(Continued)

FOREIGN PATENT DOCUMENTS

DE    31 52 742 C2    10/1983
DE      3512986 C2    10/1986
(Continued)

OTHER PUBLICATIONS

Lee et al., Preparation of TiAlN/ZrN and TiCrN/ZrN multilayers by RF magnetron sputtering, Transactions of Nonferrous Metals Society of China 19(2009) 795-799.*
(Continued)

*Primary Examiner* — Nicholas L Foster
(74) *Attorney, Agent, or Firm* — Robert L. Stearns; Dickinson Wright, PLLC

(57) ABSTRACT

The invention relates to a piston ring which is produced from a carrier material, especially steel or a cast material. The piston ring has a wear-resistant coating from a periodic multilayer system, every periodicity consisting of at least two individual metal nitride layers. The multilayer system has superlattice structures, the thickness of an individual layer being ≥2 nm to <15 nm and the thickness of the multilayer system being >4.5 μm and adjacent individual layers within the periodicity having different metallic elements.

13 Claims, 4 Drawing Sheets

Figure 1:
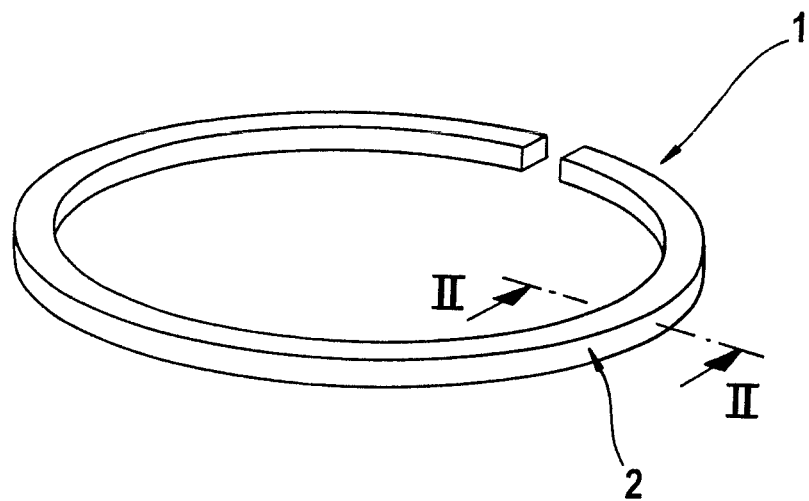

(51) Int. Cl.
*C23C 28/04* (2006.01)
*C23C 28/00* (2006.01)

(58) Field of Classification Search
USPC .................................... 277/440, 442–444
See application file for complete search history.

(56) References Cited

U.S. PATENT DOCUMENTS

| | | | |
|---|---|---|---|
| 4,945,640 A * | 8/1990 | Garg et al. ................. | 30/350 |
| 5,478,634 A * | 12/1995 | Setoyama .......... | C03C 17/3435 |
| | | | 428/212 |
| 5,593,234 A * | 1/1997 | Liston ............................ | 384/492 |
| 5,679,448 A * | 10/1997 | Kawata ......................... | 428/216 |
| 5,882,777 A * | 3/1999 | Kukino et al. ............... | 428/216 |
| 6,139,022 A * | 10/2000 | Iwashita et al. ............. | 277/443 |
| 7,008,688 B2 * | 3/2006 | Toihara ......................... | 428/216 |
| 7,060,345 B2 * | 6/2006 | Fukui et al. .................. | 428/216 |
| 7,081,186 B2 | 7/2006 | Ehiasarian et al. | |
| 7,348,074 B2 * | 3/2008 | Derflinger ..................... | 428/699 |
| 8,142,912 B1 * | 3/2012 | Chang et al. ................ | 428/698 |
| 2002/0039670 A1 * | 4/2002 | Ishikawa .............. | C23C 30/005 |
| | | | 428/697 |
| 2003/0026966 A1 * | 2/2003 | Kobayashi .............. | C22C 29/08 |
| | | | 428/217 |
| 2004/0191579 A1 * | 9/2004 | Ge ................................ | 428/698 |
| 2006/0222894 A1 * | 10/2006 | Bjormander et al. ........ | 428/701 |
| 2007/0228664 A1 * | 10/2007 | Anand et al. ................. | 277/399 |
| 2010/0044968 A1 | 2/2010 | Fischer et al. | |
| 2013/0004756 A1 * | 1/2013 | Kennedy et al. ............. | 428/216 |

FOREIGN PATENT DOCUMENTS

| | | |
|---|---|---|
| DE | 4441136 A1 | 7/1995 |
| DE | 10061749 A1 | 6/2002 |
| DE | 102004028486 | 12/2005 |
| DE | 102006046917 B3 | 2/2008 |
| EP | 0709483 A2 | 5/1996 |
| EP | 2089643 B1 | 12/2014 |
| JP | H09133138 A | 5/1997 |
| JP | H11172413 A | 6/1999 |
| JP | 2000144376 A | 5/2000 |
| JP | 2002-256967 | 9/2002 |
| JP | 2004042192 A | 2/2004 |
| JP | 2005-082822 | 3/2005 |
| JP | 2005060810 A | 3/2005 |
| JP | 2005-187859 | 7/2005 |

OTHER PUBLICATIONS

Pellizzari et al., "Thermal fatigue resistance of plasma duplex-treated tool steel", Surface and Coatings Technology 142-144 (2001) 1109-1115.*
Hovsepian P.E. et al: "Chromium nitride/niobium nitride superlatice coatings deposited by combined cathodic-arc/unbalanced magnetron technique" Surface and Coatings Technology 116-119 (1999) 727-734.
Purandare Y.P. et al: "Velocity effects on erosion-corrosion of CrN/NbN "superlatice" PVD coatings" Surface and Coatings Technology 201 (2006) 361-370.
Hovsepian P.E. et al: "Corrosion resistance of CrN/NbN superlattice caotings grown by various physical vapour deposition techniques" Thin Solid Films 488 (2005) 1-8.
"Superlattice" Wikipedia Encyclopedia Oct. 8, 2011, pp. 1-3.
Beporad E. et al.: Characterisation and wear properties of industrially produced nanoscaled CrN/NbN multilayer coating, Surface & Coatings Technology 2004, 188-189, S. 319-330.
Pecchio C. et al.: "Production of CrN/NbN superlattice coatings by cathode switching reactive cathodic arc evaporation",: Surface Treatment VI: 6th Int. Conference on Computer Methods and Experimental Measurements for Surface Treatment Effects, Crete, Greece, März 2003, S. 61-70.
Munz W-D. et al., Industrial scale manufactured superlattice hard PVD coatings, Surface Engineering 2001, 17(1), S. 15-27.
W.D. Sproul, Multilayer, multicomponent, and multiphase physical vapour deposition coatings for enhanced performance, J. Vac. Sci. Technol. (1994), Ai 2(4):1595-1601.
Hovesepian et al.: CrAlYN/CrN superlattice coatings deposited by the combined high power impulse rnagetron sputtering / unbalanced magnetron sputtering technique in Surface and Coatings Technology 201 (2006) 4105-4110.
X Chu et al., Reactive unbalance magnetron sputter deposition of polycrystalline TiN/NbN superlattice coatings, in Surface and Coatings Tecl-mology 57 (1993) 13-18.
Barshilia Harish C and Rajam, KS (2003) Nanolayered TiN/NbN ilifultilayers as New Superhard Materials. In: International Conference on Advances in Surface Treatment: Research amp; Applications (SMT XVII amp; IFHTSE), Hyderabad, India; Paper 129.
Barshilia, Harish C and Rajam, KS (2003) Deposition of TiN/CrN hard superlattices by reactive d.c.1 3; magi, letron sputtering. Bulletin of Material Science, 26 (2). pp. 233-237.
Barshilia, Harish C and Rajam, KS and Jain, Anjana (2003) Structure, hardness and thermal stability of nanolayered TiN/CrN multilayer coatings. Vacuum, 72 (3). pp. 241-248.
Barshilia, Harish C and Rajam, KS (2004) Structure and properties of reactive DC magnetron sputtered TiN/NbN hard superlattices. Surface and Coatings Technology, 183 (2amp;3). pp. 174-183.
Barshilia, Harish C and Surya Prakash, M and Aithu, Poojari and Rajam, KS (2004) Corrosion behavior of nanolayered TiNyNbN multilayer coatings prepared by reactive direct current magnetron sputtering process. Thin Solid Films, 460 (1-2). pp. 133-142.
Barshilia, Harish C and Surya Prakash, M and Anjana, Jain and Rajam, KS (2004) Structure, hardness and thermal stability of 17/11N and nanolayered TtAlN/CrN multilayer xFB01;lms. Vacuum, 77 (2). pp. 169-179.
Barshilia, Harish C and Rajam, KS and Gopinadhan, K and Chaudhary, Sujeet (2005) A comparative study on the structure and properties of nanolayered TiN/NbN and TiA1N/TiN multilayer coatings prepared by reactive direct current magnetron sputtering. Thin Solid Films, 503 . pp. 158-166.
Barshilia, Harish C and Selvakumar, N and Deepthi, B and Rajam, KS (2006) A comparative study of reactive direct current magnetron13; sputtered CrAlN and CrN coatings. Surface and Coatings Technology, 201 (6). pp. 2193-2201. ISSN 0257-8972.
Barshilia, Harish C and Deepthi, B and Rajam, KS (2006) Deposition and characterization of TiAlN/Si3N4 superhard] 3; nanocomposite coatings prepared by reactive direct currentl3; unbalanced magnetron sputtering. Vaccum, 81 (4). pp. 479-488.
Purdanre Y , Stack M.M. & Hovsepian P., A study of the erosion-cmosion of PVD CrN/NbN superlattice coating in aquous slurries,—Wear 259 (2005), 256-262.
Chu X et al: "Deposition and Properties of Polycrystalline TiN/NbN superlattice Coatings" Journal of Vacuum Science & Technology A (Vacuum, Surfaces, and Films) USA, Bd. 10.
Nr. 4, Jul. 1992 (Jul. 1992), Seiten 1604-1609, XP002481492 ISSN: 0734-2101 Abbildung 4; Tabelle 1.
Hovsepian P E et al: "Recent Progress in Large-Scale Production of Nanoscale Multilayer/Supe" Vacuum, Pergamon Press, GB, Bd. 69, Nr. 1-3, Dec. 24, 2003 (Dec. 24, 2003).
Seiten 27-36, XP008049315 ISSN: 0042-207X in der Anmeldung erwahnt Seite 31, linke Spalte, Zeile 13-rechte Spalte, Zeile 6; Abbildung 1.

* cited by examiner

PISTON RING FOR INTERNAL COMBUSTION ENGINES

BACKGROUND OF THE INVENTION

1. Technical Field

The invention relates to a piston ring made of a carrier material, in particular of steel or a cast material, with a wear-resistant coating consisting of a periodic multilayer system, with each periodicity consisting of at least two individual layers of metal nitrides.

2. Related Art

The running surfaces of piston rings in internal combustion machines are subject to wear and tear during use. In order to minimize wear and tear, the running surfaces of the piston rings are provided with a protective layer.

From JP 2005-082822 AA and JP 2005-187859 AA a carrier material with a multilayer system has been known which features metal nitride layers. No reference can be found in either prior printed publication with regard to other metallic elements in the individual layers made of metal nitrides.

DE 44 41 136 A1 discloses a pressure ring for a piston of a piston cylinder arrangement of a piston combustion engine. The wear-resistant coating consists of a nitride such as CrN, $Cr_2N$, TiN, Ti/TiN or ZrN. The coating consists only of one single layer. No reference to a multilayer system can be found in DE 44 41 136 A1.

JP 2002-256967 AA discloses a gliding element with a wear-resistant coating. It mentions as an example a piston ring that features a layer on the basis of metal nitrides. In this prior printed publication, no references to any multilayer systems can be found either.

From DE 100 61 749 A1, a wear-resistant coating for piston rings in internal combustion engines has been known that essentially consists of chromium carbides, chromium, nickel and molybdenum. A powder consisting of these components is applied to the piston rings by means of high velocity oxygen fuel spraying. Although such protective layers showed good results with regard to wear and tear, crack resistance—in particular under great stress as it occurs in modern diesel engines—is not satisfactory.

In the area of tools subject to high stress such as, for example, cutting tools, it has long been known to provide multilayer systems as a protective layer. From DE 35 12 986 C2, a wear-resistant coating has been known whose individual layer thicknesses lie within a range of 0.5 to 40 nm. To the extent that a TiN layer is used as an individual layer, it is combined with an additional individual layer made of a carbide or a boride.

This multilayer technology has also found entry into the manufacture of piston rings. From JP 2005-060810 A, piston rings for internal combustion engines have been known that are equipped with a multilayer system whose individual layers have the same metallic component and that differ only in nitrogen contents. The layer thicknesses of the individual layers are indicated as <1 μm. The layers are applied by means of a PVD process, in particular of an electric arc process.

DE 10 2004 028 486 A1 describes a gliding component such as, for example, piston rings for internal combustion engines, that features a coating of several individual layers that consist alternatingly of chromium and chromium nitride. The chromium nitride layers may be made of CrN, Cr2N or mixtures thereof. To avoid any jagged transitions, the coating process is controlled in such a way that the individual chromium nitride layers each have a border of Cr2N and a core of CrN. Each individual layer is at least 0.01 μm thick. The maximum thickness amounts to 10 μm. Total thickness of the coating is indicated as 5 to 100 μm.

However, these known multilayer systems have the disadvantage that crack resistance is not satisfactory.

This also applies to multilayer systems with superlattice structures.

In "Recent progress in large-scale production of nanoscale multilayer/superlattice hard coatings" by P. Eh. Hovsepian, W.-D. Münz in VACUUM 69 (2003), such superlattices are described that occur when the individual layers of a multilayer system have a thickness within the range of the lattice dimensions. The properties of the multilayer system deviate from the material properties of the individual layers to the effect that, for example, the hardness of the multilayer system is significantly greater than that of the individual layers. The following layer systems with an overall thickness of 1.6 to 4 μm are described:

TiAlCrN/TiAlYN/TiAlN/CrN/TiAlN/VN, Cr/C, CrN/NbN.

The thickness of the periodicity lies within a range of 1.6 to 4 nm which in the case of a multilayer system with a periodicity of two individual layers corresponds to an individual layer thickness of 0.8 to 2 nm. In the case of multilayer systems made of TiN/VN, the hardness is two to three times greater than that of the individual layers made of TiN or, respectively, of VN.

The TiAlN/VN system is described as a wear-resistant multilayer system whose periodicity is indicated as 3 nm. The values for plastic hardness lie at 406 Pa. However, at high mechanical stress during an unlubricated wear test against a sphere of 100 Cr6 a detachment of several individual layers within a magnitude of 8 to 10 nm occurs due to an aggregation of cracks.

Due to these disadvantages, the multilayer systems with superlattice structures could so far not be put to use for high-stress gliding applications, in particular in the case of piston rings.

An additional disadvantage lies in the fact that due to the great hardness the cylinder path in the engine wears out too much. These known multilayer systems are not suitable for piston rings for this reason as well.

Starting from JP 2005-060810 A, the objective of the invention is to provide a piston ring with a multilayer system that, with good wear resistance, is less prone to cracks and that subjects the cylinder path only to minimal wear.

SUMMARY OF THE INVENTION AND ADVANTAGES

This task is solved by means of a piston ring in which the multilayer system features a superlattice, with the thickness of an individual layer amounting to ≥2 to <15 nm and the thickness of the multilayer system amounting to >4.5 μm, with adjoining individual layers within one periodicity having different metallic elements.

Superlattice structures are created by a disturbed lattice arrangement in the immediate vicinity of the lattice of the adjoining individual layer. The individual layers influence each other in the border area to the effect that the lattice parameters are altered there. Due to the relatively great thickness of the individual layers, which for example are formed by 7 to 35 atom layers, a core area is created in each individual layer in which a lattice forms that corresponds to that of a single layer coating. This core area is bordered by a superlattice structure towards the layer edges.

Between the superlattice structure and the undisturbed core structure there is continual adaptation of the lattice parameters and thus a continual adaptation of the energetic status of the lattice. Should a crack occur, it will initially run into the superlattice area where it is slowed down but not always stopped. If the crack continues, it will run through the continually changing lattice all the way into the core area of the individual layer. The advantage lies in the fact that the crack energy is continually more and more absorbed and the crack is thereby continually deviated or, respectively, stopped. Crack propagation is thereby stopped sooner than is the case with pure superlattice structures without the described core areas.

Another advantage lies in the fact that the core areas reduce the hardness which is typically greater in the superlattice areas, thereby minimizing the wear of the cylinder path.

It has turned out that a multilayer system made of nitride layers shows good wear resistance on the one hand and, on the other hand, is less prone to crack due to the use of different metals for the adjoining individual layers within the periodicity. Through the use of different metals for the metal nitrides, hardness and elasticity properties of the layer composition can be adjusted.

The life of piston rings with such a multilayer system is significantly longer than in the case of piston rings with a traditional individual layer or with a multilayer system that does consist of nitride layers but in which only the nitrogen contents is changed and the metal component stays the same.

Moreover, it turned out that due to the overall thickness of more than 4.5 μm and the great number of individual layers—which number more than 300—as a consequence thereof, the entire layer system apparently has greater ductility than is the case with thinner layer systems; this further reduces proneness to crack.

Preferably the individual layers contain nitrides of at least one metal from the group of titanium (Ti), zirconium (Zr), hafnium (Hf), vanadium (V), niobium (Nb), tantalum (Ta), chromium (Cr), molybdenum (Mo) and wolfram (W).

In principle, all combinations of nitrides of the aforementioned metals are possible. This may involve stoichiometric phases or non-stoichiometric phases or mixtures thereof. For example, CrN is to be understood as one or several phases of the Cr—N system; this applies analogously to the other systems. Depending on the coating process, one or the other combination may perhaps be preferred.

Particularly preferred is the use of CrN for at least one individual layer of the periodicity. CrN may be combined in the multilayer system with the nitrides of all other metals of the aforementioned group.

Preferred combinations of individual layers are CrN/TiN, CrN/ZrN, or CrN/VN.

The periodicity may also have more than two individual layers, preferably up to four. Two individual layers are preferred in as much as the manufacturing expenditures significantly increase with the increasing number of individual layers per periodicity.

Preferably, one individual layer of the periodicity contains at least >0 to 15 weight percent, in particular 3 to 8 weight percent, of at least one of the doping elements aluminum, silicon or carbon. These doping elements cause the wear-resistant layers to have higher oxidation resistance and lower friction coefficients.

Preferably, the doping elements of adjoining individual layers will be different. The differences in the properties of the adjoining individual layers are further increased through the addition of the doping elements which has a particularly favorable effect on the prevention of crack propagation vertically to the individual layers.

It is also possible that at least one of the individual layers of the periodicity contains nitrides of at least two metals from the group of Ti, Zr, Hf, V, Nb, Ta Cr, Mo and W, with adjoining individual layers differing in at least one metallic element.

Preferred metal combinations of the nitrides for at least one individual layer of the periodicity consist of the Ti—Zr—N, Ti—Al—N, Cr—Si—N, Cr—Zr—N, Cr—Ti—N or Cr—V—N systems. The aforementioned metal combinations may also contain the aforementioned doping elements. The advantages of these metal combinations for the individual layers lie in the fact that the respective materials properties can be varied and adjusted. lie in the fact that the respective material properties can be varied and adjusted.

Following one periodicity or several periodicities, at least one interlayer made of at least one of the metals Ti, Zr, Hf, V, Nb, Ta, Cr, Mo, W may be provided. The advantages of these interlayers lie in the fact that as ductile metals, they are able to divert or, respectively, to stop any crack propagations and to significantly increase the overall ductility of the multilayer combination to the effect that the overall internal stresses can be reduced. This is particularly important for the separation of wear-resistant coatings that are separated with a greater layer thickness to increase the usable life.

Preferably, at least one undercoating which may consist of at least one of the metals Ti, Zr, Hf, V, Nb, Ta, Cr, Mo, W is provided between the carrier material and the first individual layer.

A savings can be achieved if the undercoating material is identical with the material of the interlayer or with a metal of an individual layer. In that case, the separation process merely needs to be modified via the composition of the process gas.

Preferred undercoating materials are chromium and titanium, in particular in the case of carrier materials made of steel because they show particularly good adhesion to steel materials.

Preferably, the thickness of an individual layer amounts to 5 nm to <15 nm, particularly preferred 8 nm to <15 nm, and particularly preferred 10 nm to <15 nm.

It has turned out that with regard to wear resistance, there is an optimal value for the periodicity for any material combination of the individual layers.

The thickness of the multilayer system preferably amounts to >4.5 μm to 60 μm, particularly preferred 5 μm to 60 μm, in particular 10 μm to 40 μm. These thicknesses are below the thicknesses that are needed for layers according to the state of the art, for example for a single-layer chromium nitride layer in order to assure the same useful life. Reducing the thickness of the wear-resistant coating saves material and time during the manufacture of the coating.

Preferably, the multilayer system is applied by means of a PVD process.

The metal nitrides TiN, ZrN, VN, CrN and MoN can be applied particularly advantageously by means of the PVD processes.

The electric arc process is intended as the preferred process in order to apply the multilayer system.

The multilayer system may also be applied by means of a CVD process.

Particular use of such piston rings in accordance with the invention is intended for diesel engines and gasoline engines.

The wear-resistant coating is particularly suitable for compression rings and for oil rings.

THE DRAWINGS

Figure 2:
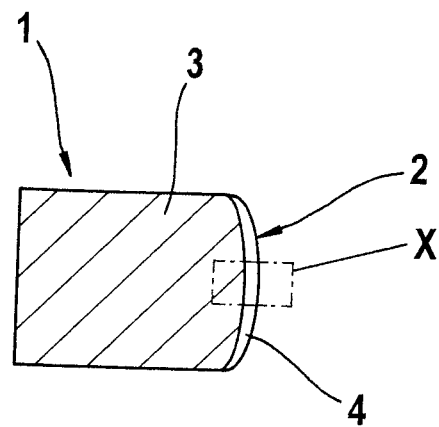
Figure 3:
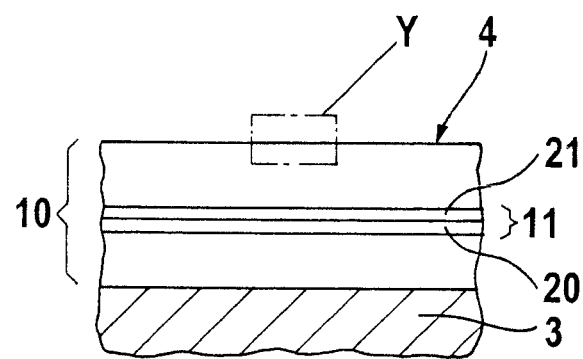
Figure 4:
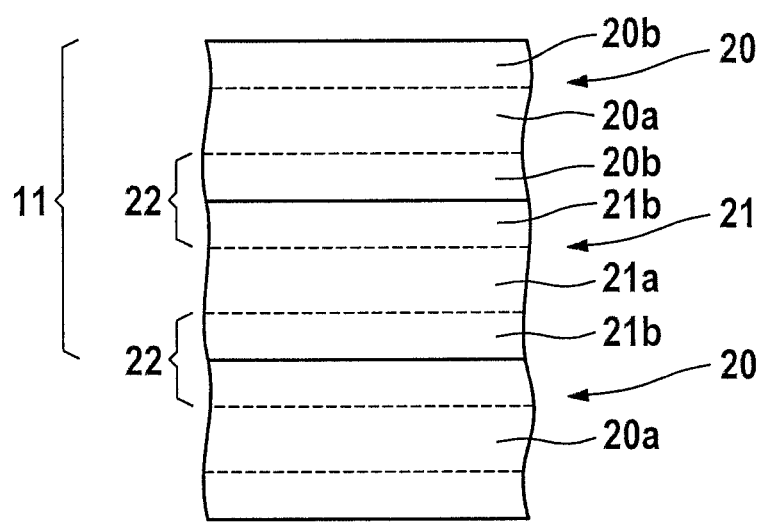
Figure 5:
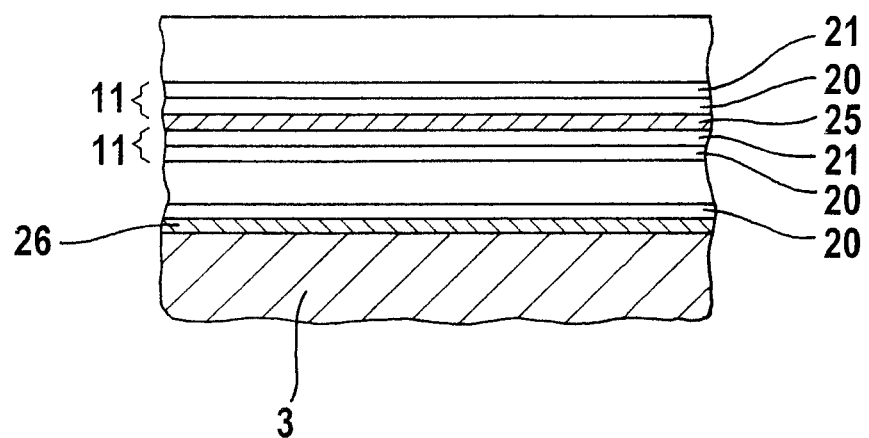

Examples of embodiments of the inventions will be explained in detail in the following by way of the drawings. Shown are in:

FIG. 1 a piston ring in a perspective representation,
FIG. 2 a cut along line II-II through the piston ring shown in FIG. 1,
FIG. 3 an enlarged representation of detail X from FIG. 2,
FIG. 4 an enlarged representation of detail Y from FIG. 3,
FIG. 5 a schematic representation of a multilayer system in accordance with an additional form of embodiment.

DETAILED DESCRIPTION

A piston ring 1 is represented perspectively in FIG. 1. The exterior circumferential surface forms the running surface 2.

A cut along the line II-II through the piston ring 1 shown in FIG. 1 is shown in FIG. 2. The running surface 2 has a slightly spherical shape. The wear-resistant coating 4 deposited on the carrier material 3 reproduces this spherical shape.

An enlarged representation of detail X from FIG. 2 is represented in FIG. 3. The multilayer system 10 which is formed by a multitude of periodicities 11 is located on the carrier material 3. Each periodicity 11 consists of two individual layers 20, 21, with only one periodicity 11 having been drawn for the sake of clarity.

An enlargement of detail Y from FIG. 3 is represented in FIG. 4. Superlattice structures are created by a disturbed lattice arrangement in the immediate vicinity of the lattice of the adjacent individual layer 20, 21. The individual layers 20, 21 influence each other in the border area 22 to the effect that the lattice parameters are altered there. Due to the relatively great thickness of the individual layers 20, 21, which for example are formed by 7 to 35 atom layers, a core area 20a, 21a is created in each individual layer 20, 21 in which a lattice forms that corresponds to that of a single layer coating. This core area is bordered by a superlattice structure 20b, 21b towards the layer edges.

The preferred metals of the metal nitrides are shown in the following Table 1 in a matrix. All metal nitride combinations for the adjacent individual layers are provided in accordance with the invention with the exception of the identity. The particularly preferred metal nitride combinations are marked by an X.

TABLE 1

| System No.. | | Ti | Zr | Hf | V | Nb | Ta | Cr | Mo | W |
|---|---|---|---|---|---|---|---|---|---|---|
| | | | | | (metal of the metal nitrides) | | | | | |
| 1 | Ti |   | X | X | X | X | X | X | X | X |
| 2 | Zr | X |   | X | X | X | X | X | X | X |
| 3 | Hf | X | X |   | X |   |   | X |   |   |
| 4 | V | X | X | X |   | X | X | X | X | X |
| 5 | Nb | X | X |   | X |   |   | X |   |   |
| 6 | Ta | X | X |   | X |   |   | X |   |   |
| 7 | Cr | X | X | X | X | X | X |   | X | X |
| 8 | Mo | X | X |   | X |   |   | X |   |   |
| 9 | W | X | X |   | X |   |   | X |   |   |

System number 7 according to which a CrN layer is always involved within the periodicity as an individual layer is characterized by particularly good stability of the multilayer system. System numbers 1, 2 and 4 indicate metal nitride combinations that can be separated particularly favorably with the electric arc process.

A multilayer system 10 in accordance with an additional embodiment is represented in FIG. 5. An interlayer 25 is provided in each case between the periodicities 11. In addition, an undercoating 26 is provided between the first individual layer and the carrier material 3. It is also possible to provide only one undercoating, or only interlayers.

What is claimed is:

1. A piston ring comprising a carrier material of steel or a cast material, and with a wear-resistant coating made of a periodic multilayer system,
   with each periodicity of the periodic multilayer system consisting of two individual layers,
   each of said individual layers consisting of metal nitrides,
   each of said individual layers having a core area including a lattice, said core area being undisturbed,
   at least one of said individual layers including Ti—Zr—N, Cr—Si—N, Cr—Zr—N, or Cr—V—N;
   the multilayer system including superlattice structures bordering said core areas of said individual layers,
   with the thickness of each individual layer amounting to ≥2 nm to <15 nm, and the thickness of the multilayer system amounting to >4.5 μm, and
   adjoining individual layers within each periodicity having different metallic elements,
   wherein at least after one or several periodicities between two adjacent periodicities at least one interlayer and no layer other than the at least one interlayer is provided,
   wherein the at least one interlayer is made of at least one metal from the group consisting of: Ti, Zr, Hf, V, Nb, Ta, Cr, Mo and W.

2. The piston ring in accordance with claim 1, wherein at least one undercoating is provided between the carrier material and the wear-resistant coating.

3. The piston ring in accordance with claim 2, wherein the undercoating consists of at least one of the metals from the group consisting of: Ti, Zr, Hf, V, Nb, Ta, Cr, Mo and W.

4. The piston ring in accordance with claim 1, wherein the thickness of said each individual layer amounts to 5 nm to <15 nm.

5. The piston ring in accordance with claim 1, wherein the thickness of the multilayer system amounts to >4.5 μm to 60 μm.

6. The piston ring in accordance with claim 1, wherein the multilayer system is applied by means of a PVD process.

7. The piston ring in accordance with claim 1, wherein the multilayer system is applied by means of an electric arc process.

8. The piston ring in accordance with claim 1, wherein the multilayer system is applied by means of a CVD process.

9. The piston ring in accordance with claim 4, wherein the thickness of said each individual layer amounts to 8 nm to <15 nm.

10. The piston ring in accordance with claim 9, wherein the thickness of said each individual layer amounts to 10 nm to <15 nm.

11. The piston ring in accordance with claim 5, wherein the thickness of the multilayer system amounts to 5 μm to 60 μm.

12. The piston ring in accordance with claim 11, wherein the thickness of the multilayer system amounts to 10 μm to 40 μm.

13. A piston ring made of a carrier material of steel or a cast material, and with a wear-resistant coating comprising a periodic multilayer system, with each periodicity of the periodic multilayer system consisting of two individual layers,
each of said individual layers consisting of metal nitrides,
at least one of said individual layers including Ti—Zr—N, Cr—Si—N, Cr—Zr—N, or Cr—V—N;
each of said individual layers having a core area including lattice, said core area being undisturbed,
the multilayer system including superlattice structures bordering said core areas of said individual layers,
with the thickness of each individual layer amounting to ≥2 nm to <15 nm, and the thickness of the multilayer system amounting to >4.5 μm, and
adjoining individual layers within each periodicity having different metallic elements.

* * * * *